USO12218064B2

(12) United States Patent
Cheah et al.

(10) Patent No.: US 12,218,064 B2
(45) Date of Patent: Feb. 4, 2025

(54) MOLDED SILICON INTERCONNECTS IN BRIDGES FOR INTEGRATED-CIRCUIT PACKAGES

(71) Applicant: Intel Corporation, Santa Clara, CA (US)

(72) Inventors: Bok Eng Cheah, Bukit Gambir (MY); Jenny Shio Yin Ong, Bayan Lepas (MY); Seok Ling Lim, Kulim (MY); Jackson Chung Peng Kong, Tanjung Tokong (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 359 days.

(21) Appl. No.: 17/631,254

(22) PCT Filed: Jun. 26, 2020

(86) PCT No.: PCT/US2020/039891
§ 371 (c)(1),
(2) Date: Jan. 28, 2022

(87) PCT Pub. No.: WO2021/040877
PCT Pub. Date: Mar. 4, 2021

(65) Prior Publication Data
US 2022/0302033 A1   Sep. 22, 2022

(30) Foreign Application Priority Data

Aug. 30, 2019 (MY) ................................ 2019005034

(51) Int. Cl.
*H01L 23/538* (2006.01)
*H01L 23/00* (2006.01)
(Continued)

(52) U.S. Cl.
CPC .... *H01L 23/5381* (2013.01); *H01L 23/49816* (2013.01); *H01L 23/5383* (2013.01);
(Continued)

(58) Field of Classification Search
CPC . H01L 2224/04105; H01L 2225/06544; H01L 2225/06548; H01L 2225/0654;
(Continued)

(56) References Cited

U.S. PATENT DOCUMENTS

2008/0258259 A1   10/2008  Osaka et al.
2014/0210097 A1    7/2014  Chen et al.
(Continued)

FOREIGN PATENT DOCUMENTS

EP          3051585 A1      8/2016
JP        2016046517 A      4/2016
WO   WO-2021040877 A1      3/2021

OTHER PUBLICATIONS

"International Application Serial No. PCT/US2020/039891, International Search Report mailed Oct. 12, 2020", 3 pgs.
(Continued)

*Primary Examiner* — Ictor A Mandala
*Assistant Examiner* — Lawrence C Tynes, Jr.
(74) *Attorney, Agent, or Firm* — Essential Patents Group, LLP

(57) ABSTRACT

Disclosed embodiments include silicon interconnect bridges that are in a molded frame, where the molded frame includes passive devices and the silicon interconnect bridge includes through-silicon vias that couple to a redistribution layer on both the silicon interconnect bridge and the molded frame.

17 Claims, 6 Drawing Sheets

(51) Int. Cl.
  *H01L 23/498* (2006.01)
  *H01L 25/16* (2023.01)
(52) U.S. Cl.
  CPC ...... *H01L 23/5384* (2013.01); *H01L 23/5385* (2013.01); *H01L 23/5386* (2013.01); *H01L 24/16* (2013.01); *H01L 25/16* (2013.01); *H01L 2224/16227* (2013.01)
(58) Field of Classification Search
  CPC . H01L 2225/16146; H01L 2221/68331; H01L 23/495; H01L 23/00; H01L 23/50; H01L 23/522; H01L 23/538; H01L 23/498; H01L 23/58; H01L 23/642; H01L 23/49586; H01L 23/645; H01L 23/647; H01L 23/66; H01L 23/5381; H01L 21/50; H01L 25/00; H01L 25/16; H01L 45/00; F21S 31/153
  See application file for complete search history.

(56) References Cited

U.S. PATENT DOCUMENTS

2018/0068978 A1\* 3/2018 Jeng ........................ H01L 25/50
2018/0366456 A1 12/2018 Jeong et al.
2020/0083179 A1\* 3/2020 Lee ..................... H01L 23/5384

OTHER PUBLICATIONS

"International Application Serial No. PCT/US2020/039891, Written Opinion mailed Oct. 12, 2020", 7 pgs.
"International Application Serial No. PCT US2020 039891, International Preliminary Report on Patentability mailed Mar. 10, 2022", 9 pgs.

\* cited by examiner

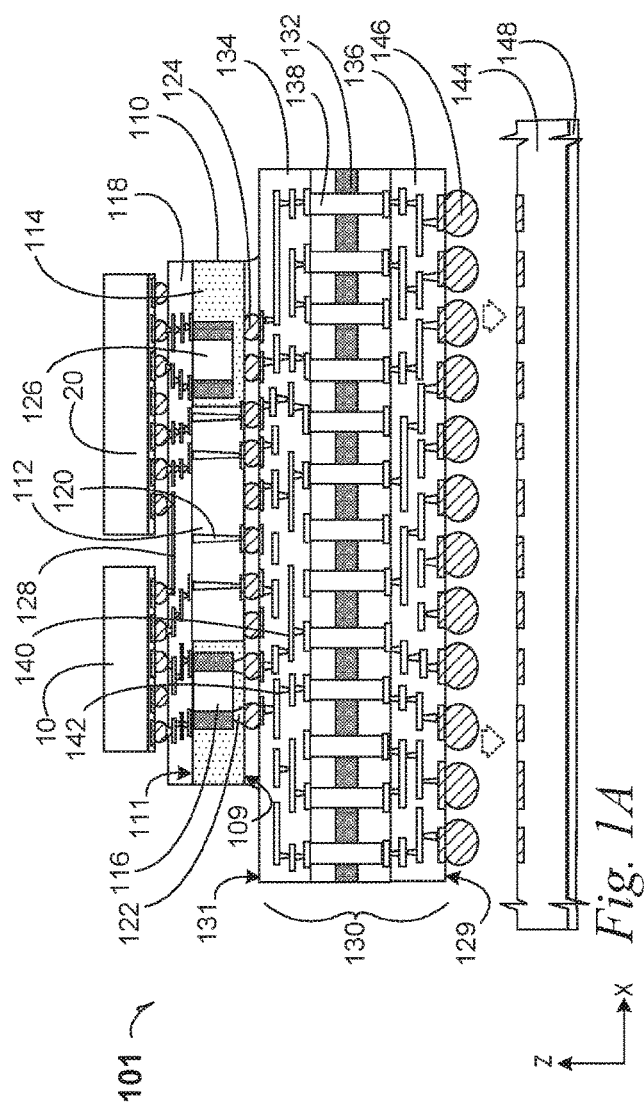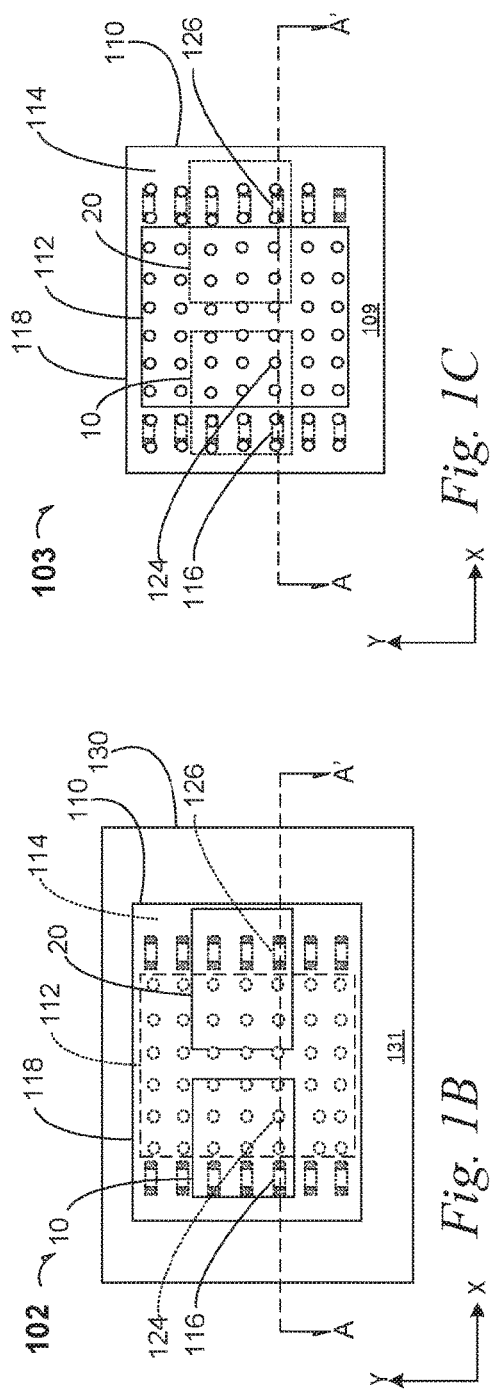

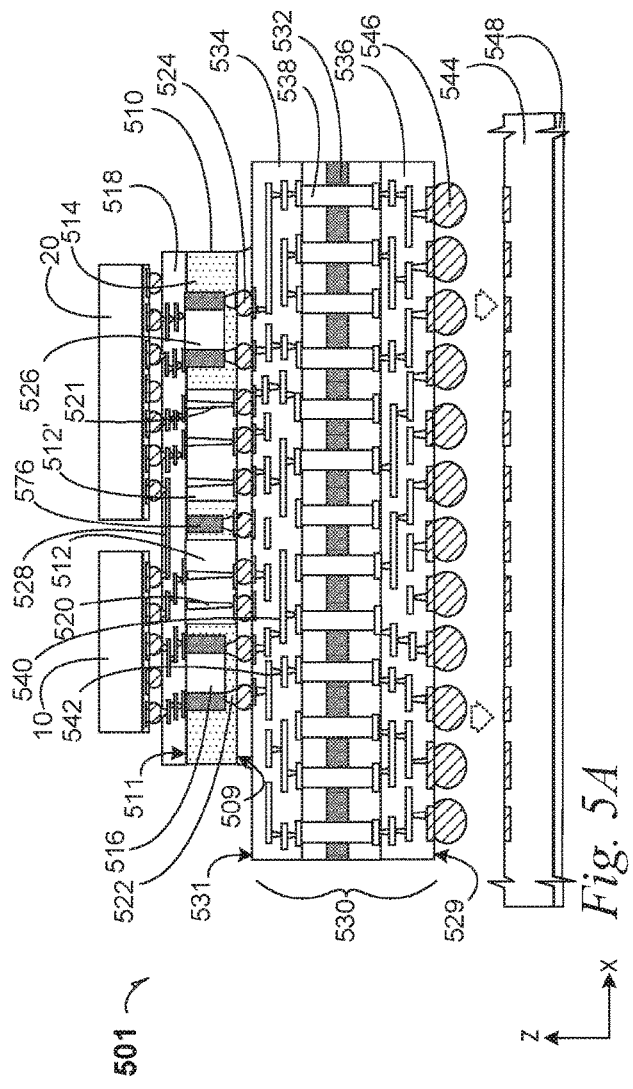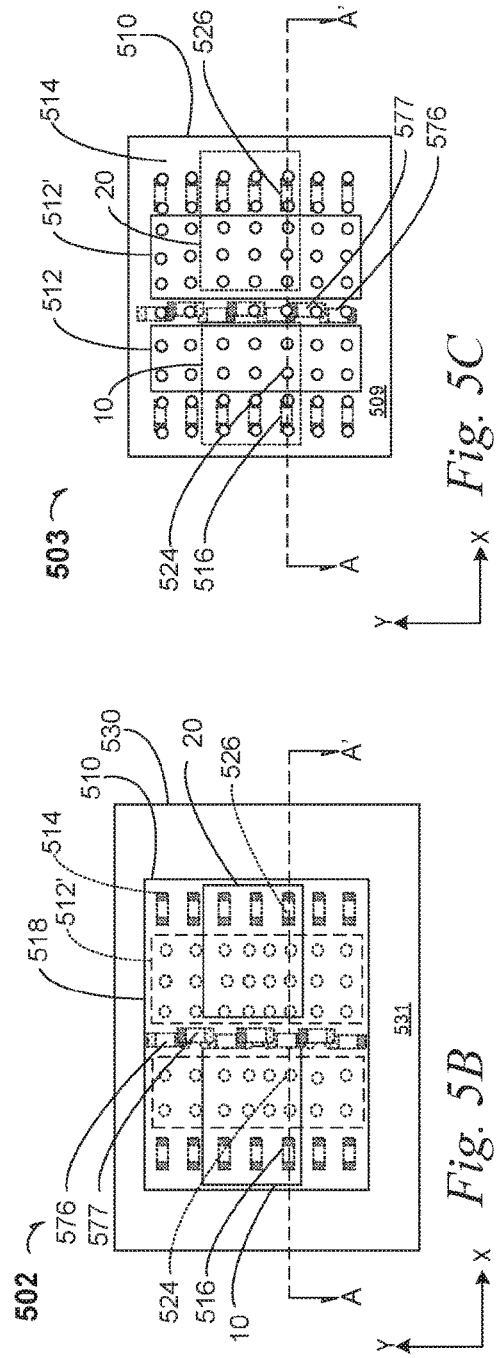

MOLDED SILICON INTERCONNECTS IN BRIDGES FOR INTEGRATED-CIRCUIT PACKAGES

PRIORITY APPLICATION

This application is a U.S. National Stage Application under 35 U.S.C. 371 from International Application No. PCT/US2020/039891, filed Jun. 26, 2020, published as WO 2021/040877, which claims the benefit of priority to Malaysian Application Serial Number PI PI2019005034, filed Aug. 30, 2019, all of which are incorporated herein by reference in their entirety.

FIELD

This disclosure relates to power delivery for integrated-circuit device packages.

BACKGROUND

Integration of multiple integrated-circuit chips within a package, for example three-dimensional (3D) stacked integrated-circuit device has power-delivery issues such as undesired inductance loops and impedance peak profiles.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of an integrated-circuit package apparatus with a molded silicon interposer bridge according to an embodiment;

FIG. 1B is a top plan of portions of the integrated-circuit package apparatus depicted in FIG. 1A according to an embodiment;

FIG. 1C is a bottom view of the molded silicon-interconnect bridge depicted in FIG. 1A according to an embodiment;

FIG. 5A is a cross-section elevation of an integrated-circuit package apparatus with dual molded silicon interposer bridges and an interstitial array of passive devices according to an embodiment;

FIG. 5B is a top plan of portions of the integrated-circuit package apparatus depicted in FIG. 5A including interstitial passive devices according to an embodiment;

FIG. 5C is a bottom view of the molded silicon-bridge interconnect depicted in FIG. 5A according to an embodiment;

DETAILED DESCRIPTION

Figure 2A:
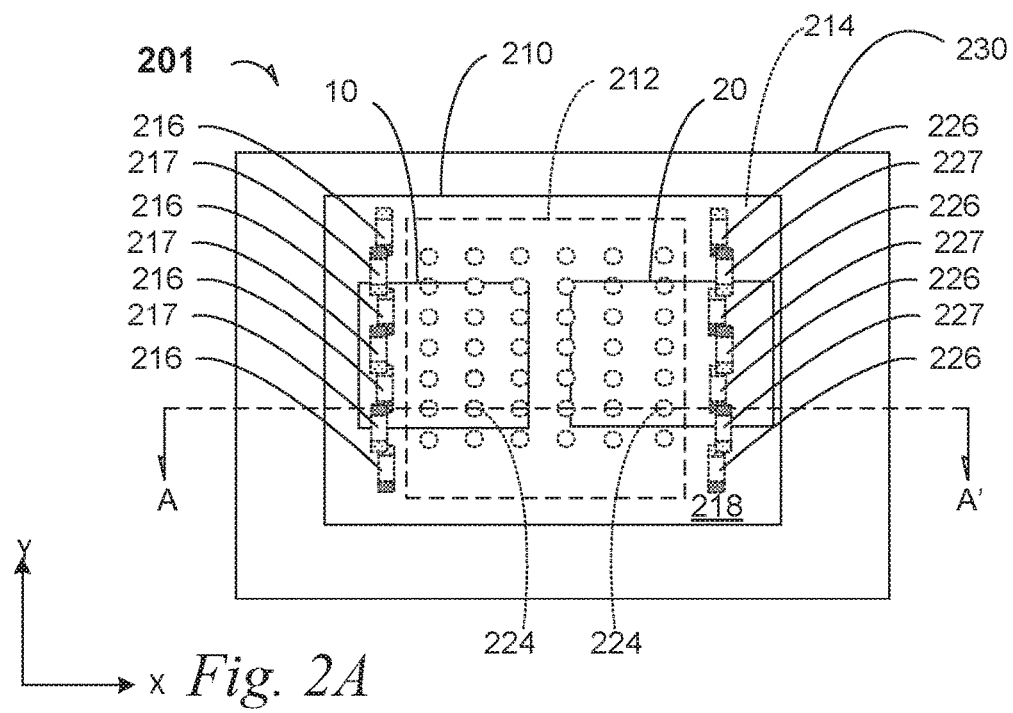
FIG. 2A is a top plan of portions of an integrated-circuit package apparatus similar to that depicted in FIG. 1B according to an embodiment.

Disclosed embodiments include molded silicon-interconnect bridges (MSiBs) that interface between integrated-circuit package substrates and integrated-circuit dice. Passive devices such as decoupling capacitors are embedded in the MSiBs such that power delivery demand changes are faster by the proximate location of the passive devices. In an embodiment, the capacitor is a multi-layer ceramic capacitor. In an embodiment, the capacitor is a silicon capacitor.

Ball-grid array densities are improved for input-output (I/O) density changes where keep-out-zone issues are addressed. Location of the passive devices, closer to the integrated-circuit dice, relieves integrated-circuit package substrate real estate issues to increase interconnect densities.

Power integrity of electrical performance is achieved by reduced package inductance looping. Decoupling capacitors are directly coupled to power rails (Vcc) and to ground (Vss), which lowers power delivery network impedance ($Z_{PDN}$) and jitter behaviors. Location of the MSiBs on a die side of an integrated-circuit package substrate, provides close CTE mismatch tolerances.

The molded silicon-interconnect bridge embodiments use the term "silicon" as a genus for semiconductive material such as silicon or III-V semiconductive material, with useful doping variations according to several embodiments. In an embodiment, the molded silicon-interconnect bridge embodiments use the term "silicon" as a genus for inorganic glass materials with useful doping variations to closely match coefficients of thermal expansions of integrated-circuit dice that use the MSiB embodiments, according to several embodiments.

FIG. 1A is a cross-section elevation of an integrated-circuit package apparatus 100 with a molded silicon interposer bridge according to an embodiment. A silicon interconnect bridge in a molding-mass frame 110 includes a die side 111 and a package side 109. A silicon interconnect bridge 112 is in a molding-mass frame 114 and at least part of the silicon interconnect bridge 112 and the molding-mass frame 114 share the die side 111. In an embodiment, the assembly may be referred to as a molded silicon-interconnect bridge (MSiB) 110.

A passive device 116 is in the molding-mass frame 114 and the silicon interconnect bridge 112 and the passive device 116, occupy at least some of the same vertical space encompassed by the molding-mass frame 114. A redistribution layer (RDL) 118 is on the die side 111 and the redistribution layer 118 is coupled to the passive device 116 and to a through-silicon via 120 in the silicon interconnect bridge 112. The through-silicon via 120 communicates to the package side 109.

In an embodiment, the passive device 116 is both coupled to the die side 111 and to the package side 109. At the package side 109, the passive device 116 is coupled by an electrical interconnect 122 to an electrical bump in an array, one electrical bump of which is indicated by reference number 124.

In an embodiment, the passive device 116 is a first passive device 116 and a subsequent passive device 126 is in the molding-mass frame 114, such that the two passive devices 116 and 126 are on opposite sides of the silicon interconnect bridge 112. As illustrated in an embodiment, the passive devices 116 and 126 are decoupling capacitors.

In an embodiment, a first integrated-circuit die 10 is on the redistribution layer 118 and a subsequent integrated-circuit die 20 is also on the redistribution layer 118, where the two IC dice 10 and 20 are side-by-side.

Interconnection between the two IC dice 10 and 20 is through an inter-die trace 128 in the RDL 118. In an embodiment, interconnection between the two IC dice 10 and 20 is by coupling through the through-silicon via 120. In an embodiment, coupling between the two IC dice 10 and 20 is through an inter-die trace 128 in the RDL 118. In an embodiment, interconnection between the two IC dice 10 and 20 is both by an inter-die trace 128 in the RDL 118 and by the TSV 120.

An integrated-circuit (IC) package substrate 130 includes a bridge side 131 and a land side 129. In an embodiment, the IC package substrate 130 includes interconnections on either side of and passing through a package core 132. A bridge-side redistribution layer (RDL) 134 and a land-side RDL 136, as well as through-core interconnects 138 provide electrical communication between the bridge side 131 and the land side 129 according to an embodiment. Within the IC package substrate 130 is a ground (Vss) plane 140 in the dielectric material of the IC package substrate 130, as well as a power (Vcc) plane 142 in the dielectric material.

In an embodiment, the land side 129 faces a board 144 such as a motherboard in a computing system, and an electrical bump array 146 is seen being brought toward the board 144. In an embodiment, the board 144 has an external shell 148 that provides at least one of physical and electrical insulative protection for components on the board 144. For example, the external shell 148 may be part of a hand-held computing system such as a communication device. In an embodiment, the external shell 148 is part of the exterior of a mobile computing platform such as a drone.

FIG. 1B is a top plan of portions of the integrated-circuit package apparatus 101 depicted in FIG. 1A according to an embodiment. The integrated-circuit package apparatus 102 shows the first and subsequent IC dice 10 and 20 on the RDL 118. The passive devices 116 and 126 are seen along a section line A-A', and the passive devices 116 and 126 are depicted in ghosted lines below the RDL 118. Further below the RDL 118, six columns of the electrical bump 124 (in ghosted lines) are also depicted in an array on the bridge side 131 of the IC package substrate 130. Two columns each of bumps 124 are below the passive devices 116 and 126 (see FIG. 1A) and they are not depicted in FIG. 1B.

Further in ghosted lines, the material of the molding-mass frame 114 occupies approximately the same perimeter as the RDL 118. Consequently, the silicon interconnect bridge 112 is framed by the material of the molding-mass frame 114.

FIG. 1C is a bottom view of the molded silicon-interconnect bridge 101 depicted in FIG. 1A according to an embodiment. The package side 109 of the mold material that makes up the molding-mass frame 114, exhibits the several capacitors 116 and 126, which are depicted in ghosted lines as they may be embedded beyond the package side 109 of the mold material that makes up the molding-mass frame 114. As illustrated in FIG. 1A, 10 electrical bumps 124 are arrayed in columns that include seven rows. These electrical bumps 124 are on the package side 109 and are in solid lines as they are not behind the package side 109 of the MSiB 110.

FIG. 2A is a top plan of portions of an integrated-circuit package apparatus 201 similar to that depicted in FIG. 1B according to an embodiment. The integrated-circuit package apparatus 201 shows respective first and subsequent IC dice 10 and 20 on an RDL 218 (depicted as an upper surface 218 of the RDL 218). Passive devices 216 and 226 are seen along a section line A-A', that is a similar placeholder as section line A-A' seen in FIG. 1B, with differences as herein discussed.

Passive devices 216, 217, 226 and 227 are arrayed in two rows or respective opposite sides of the embedded silicon-interconnect bridge 212 where passive devices 217 and 227 are respectively stacked on passive devices 216 and 226 within the mold material of the molding-mass frame 214 and the passive devices 216 and 217, and 226 and 227 are depicted in ghosted lines below the RDL 218. Further below the RDL 218, six columns of the electrical bump 224 (in ghosted lines) are also depicted in an array on the bridge side 231 of the IC package substrate 230. At least one column each of bumps 224 are below the passive devices 216 and 226 (see similar bump array 124 in FIG. 1A) and they are not depicted in FIG. 2A.

By viewing the passive devices 216 and 217 in seriatim repetition on the first side of the MSiB 212, one observes a first-side third capacitor, which is a capacitor 216 that contacts a first-side second capacitor 217, which in turn contacts a first-side first capacitor; a different occurrence of 216. Similarly by viewing the passive devices 226 and 227 in seriatim repetition on the subsequent side of the MSiB 212, one observes a subsequent-side third capacitor, which is a capacitor 226 that contacts a subsequent-side second capacitor 227, which in turn contacts a subsequent-side first capacitor; a different occurrence of 226.

Further in ghosted lines, the material of the molding-mass frame 214 occupies approximately the same perimeter as the RDL 218. Consequently, the silicon interconnect bridge 212 is framed by the material of the molding-mass frame 214.

Figure 2B:
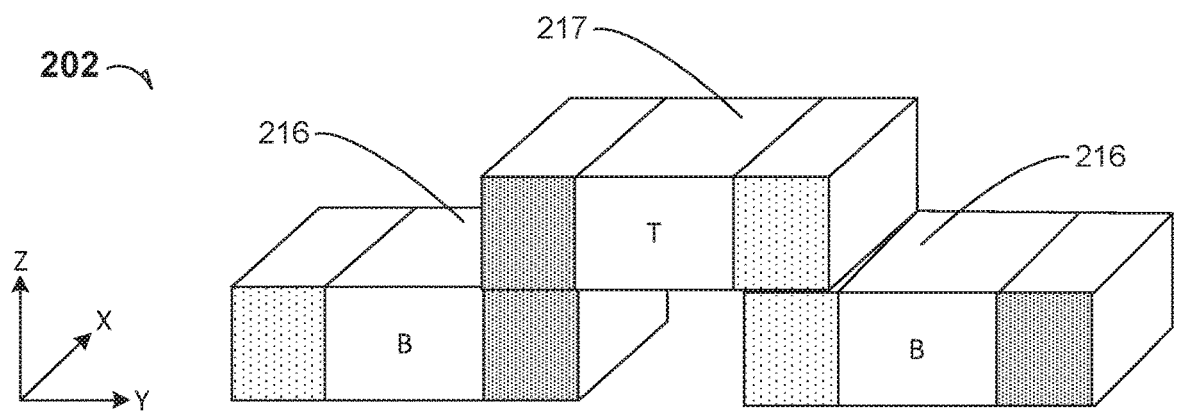
FIG. 2B is a perspective elevation of stacked passive devices according to an embodiment.

FIG. 2B is a perspective elevation of stacked passive devices according to an embodiment. Two bottom capacitor 216 are configured with a top capacitor 217, where the darker-shaded electrodes represent power terminal, and the lighter-shaded electrodes represent ground or source terminal. Consequently, a power rail is depicted where respective power terminals of the bottom 216 and top capacitor 217 make contact. Similarly, a ground (Vss) rail is depicted where the respective ground terminals of the bottom 216 and top capacitor 217 make contact.

Figure 2C:
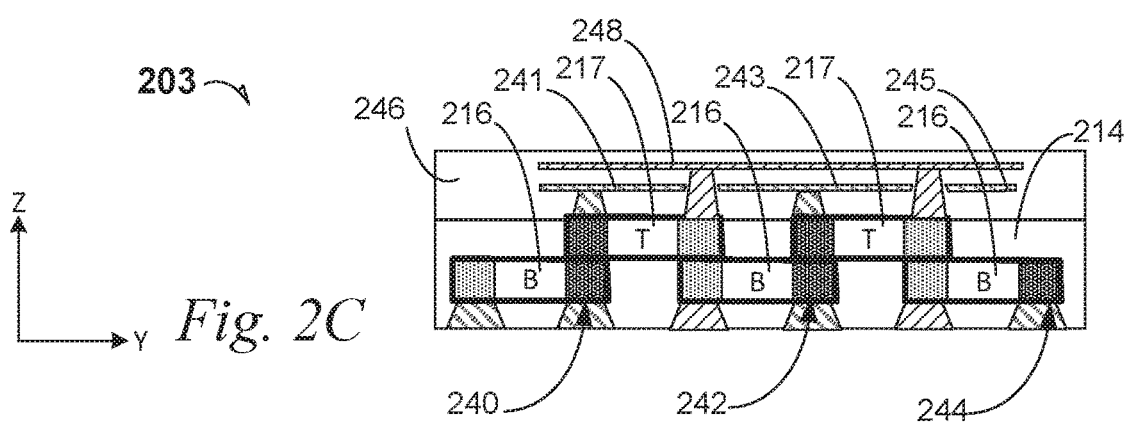
FIG. 2C is a cross-section elevation of an array of stacked passive devices in a molding mass material according to several embodiments.

FIG. 2C is a cross-section elevation of an array of stacked passive devices in a molding mass material according to several embodiments. In a multi-die embodiment, different potentials are used for various dice, such as a $V_1$ for a first die, $V_N$ for a subsequent die, and $V_3$ for a third die. In an embodiment, different voltages are used in different parts of a given die. In a non-limiting example embodiment, a stacked array of top 217 and bottom 216 capacitors are configured in a molding mass 214 where a first power rail 240 is associated with a voltage of 1.0 V, a subsequent power rail 242 is associated with a voltage of 1.5 V, and a third power rail 244 is associated with a voltage of 1.8 V. A metal build-up layer 246 is also configured, such that when assembled as an integral part of, e.g., the MSiB 210 of the integrated-circuit package apparatus 201 depicted in FIG. 2A, several different voltages may be delivered to composite power rails by use of stacked embedded capacitors. In an embodiment, the metal build-up layer 246 is part of the redistribution layer 218.

In an embodiment, a first power plane 241 is related to the first power rail 240 within the metal build-up layer 246. In an embodiment, a subsequent power plane 243 is related to the subsequent power rail 242 within the metal build-up layer 246. In an embodiment, a third power plane 245 is related to (but not connected in the drawing) the third power rail 244 within the metal build-up layer 246. In an embodiment, a ground plane 248, provides a ground voltage (Vss) reference access or current return path to several devices on the lee side of electrical-potential usage.

Figure 3:
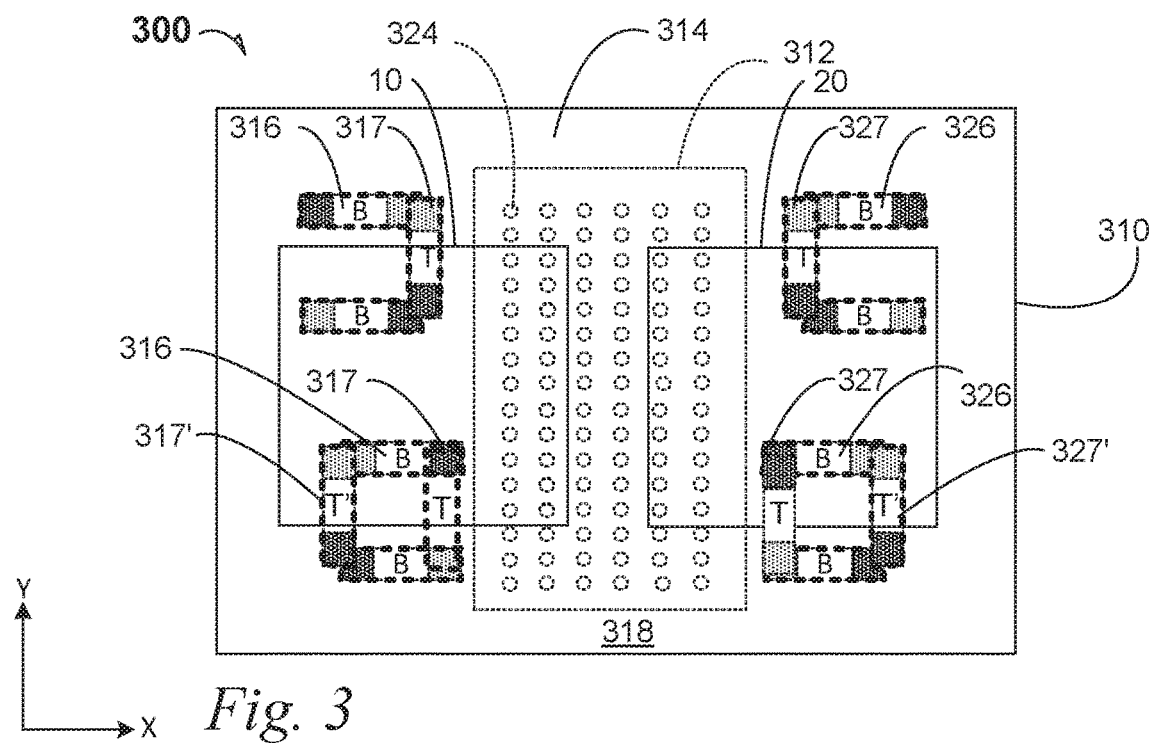
FIG. 3 is a top plan of portions of a molded silicon-interconnect bridge according to several embodiments.

FIG. 3 is a top plan of portions of a molded silicon-interconnect bridge 310 according to several embodiments. The MSiB 310 includes stacked capacitors 316 and 317, and 326 and 327 that are arrayed within molding-material 314 that makes up a molding-material frame for the MSiB 310.

As illustrated and in similar stacking fashion depicted in FIGS. 2A, 2B and 2C, power rails are formed as well as ground rails by contacting appropriate power terminals to power terminals, and ground terminals to ground terminals. Whereas the stacking fashion is in semi-circular, three-capacitor arrangements, the several configurations have different voltages for power rails according to an embodiment. For example in an embodiment, the two power rails (all capacitors 316 and 317) that are seen on the left of the silicon-interconnect bridge 312, have a voltage of 1V. The power rail (the capacitors 326 and 327 at the upper right-hand corner) has a voltage of 1.5 V. And the power rail (the capacitors 326 and 327 at the lower right-hand corner) has a voltage of 1.8 V.

In an embodiment, a different occurrence of top capacitors 317' and 327' are disposed on the bottom capacitors 316 and 326 opposite the top capacitors 317 and 327 to form a four-capacitor stacked arrangement in a circular configuration. Improved real-estate utilization can be achieved through both semi-circular and circular (or closed loop) stacked capacitor arrangements.

The molded silicon-interconnect bridge 310 shows the first and subsequent IC dice 10 and 20 on an RDL 318 (where the RDL 318 has substantially the same perimeter as the molding-material 314). The reference number 318 is showing as an upper surface. The passive devices 316 and 317, and 326 and 327 are depicted in ghosted lines below the RDL 318. Further below the RDL 318, six columns of the electrical bump 324 (in ghosted lines) are also depicted in an array on the package side 309 of the MSiB 310. At least two columns each of electrical bumps 324 are below the passive devices 316 and 326 and they are not depicted in FIG. 3.

Further in ghosted lines, the material of the molding-mass frame 314 occupies approximately the same perimeter as the RDL 318. Consequently, the silicon interconnect bridge 312 is framed by the material of the molding-mass frame 314.

Figure 4:
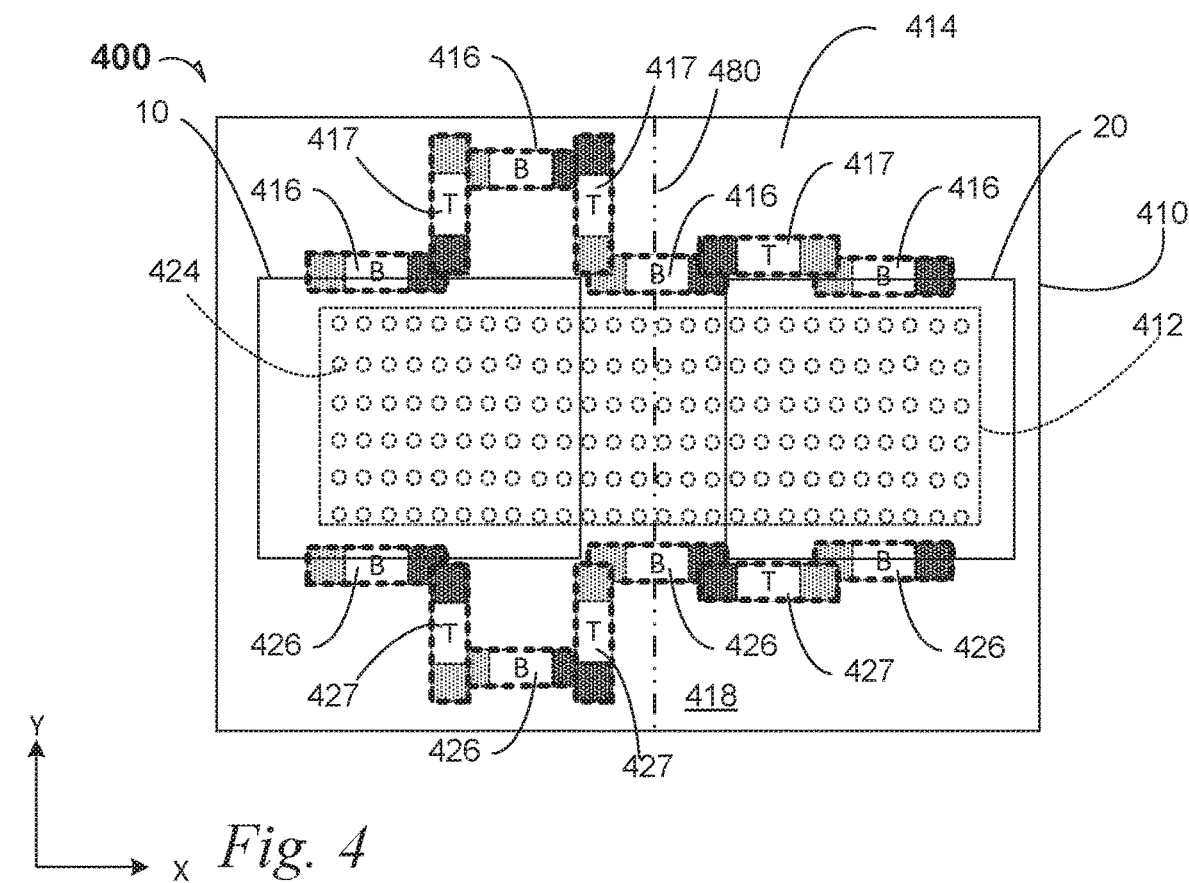
FIG. 4 is a top plan of portions of a molded silicon-interconnect bridge according to several embodiments.

FIG. 4 is a top plan of portions of a molded silicon-interconnect bridge 410 according to several embodiments. The MSiB 410 includes stacked capacitors 416 and 417, and 426 and 427 that are arrayed within molding-material 414 that makes up a molding-material frame for the MSiB 410.

As illustrated and in similar stacking fashion depicted in FIGS. 2A, 2B, 2C and 3, power rails are formed as well as ground rails by contacting appropriate power terminals to power terminals, and ground terminals to ground terminals. Whereas the stacking fashion is in semi-serpentine, seven-capacitor arrangements, the several configurations have different voltages for power rails according to an embodiment. For example, the four power rails (all capacitors 416 and 417) that are seen on the top part of the drawing of the silicon-interconnect bridge 412, have a voltage of 1V. The power rail (the capacitors 426 and 427 at the bottom left to an approximate midline 480) have a voltage of 1.5 V. And the power rail (the capacitors 426 and 427 at the bottom right to the approximate midline 480) has a voltage of 1.8 V.

The molded silicon-interconnect bridge 410 shows the first and subsequent IC dice 10 and 20 on an RDL 418 (where the RDL 418 is depicted as a top surface, which has substantially the same perimeter as the molding-material 414). The passive devices 416 and 417, and 426 and 427 are depicted in ghosted lines below the RDL 418. Further below the RDL 418, 26 columns of the electrical bump 424 (in ghosted lines) are also depicted in an array on the package side (not pictured) of the MSiB 410. More electrical bumps 424 may be located below the passive devices 416 and 417, and 426 and 427 and they are not depicted in FIG. 4.

Further in ghosted lines, the material of the molding-mass frame 414 occupies approximately the same perimeter as the RDL 418. Consequently, the silicon interconnect bridge 412 is framed by the material of the molding-mass frame 414.

FIG. 5A is a cross-section elevation of an integrated-circuit package apparatus 501 with dual molded silicon interposer bridges and an interstitial array of passive devices according to an embodiment. At least two silicon interconnect bridges in a molding-mass frame 510 includes a die side 511 and a package side 509. At least two silicon interconnect bridges 512 and 512' are in a molding-mass frame 514 and at least part of the silicon interconnect bridges 512 and 512' and the molding-mass frame 514 share the die side 511. In an embodiment, the assembly may be referred to as a molded silicon-interconnect bridge (MSiB) 510.

A first passive device 516 is in the molding-mass frame 514 and the first silicon interconnect bridge 512 and the first passive device 516, occupy at least some of the same vertical space encompassed by the molding-mass frame 514. A subsequent passive device 526 is in the molding-mass frame 514 and the subsequent silicon interconnect bridge 512' and the subsequent passive device 526, occupy at least some of the same vertical space encompassed by the molding-mass frame 514.

In an embodiment, an interstitial passive device 576 is located within the molding material of the molding-mass frame 514, between the first silicon interconnect bridge 512 and the subsequent silicon interconnect bridge 512'. Consequently, a multiple-bridge, molded silicon-interconnect bridge (MBMSiB) 510 is achieved with an interstitial passive device. The MBMSiB 510 creates useful decoupling-capacitor locations to support the first IC die 10 and the subsequent IC die 20.

In an embodiment, any of the stacked passive device embodiments are located within the molding-mass frame 514. In an embodiment, the C- or circular-stacked capacitors 316 and 317 in FIG. 3 are located at the Z-level of the X-Y location of the first passive device 516. In an embodiment, all capacitors 516 and 526 are C- or circular-stacked capacitors. In an embodiment, the stacked-capacitor string 216 and 217 embodiments in FIG. 2A, are located at the Z-level of the X-Y location of the interstitial capacitor 576. In an embodiment, the semi-serpentine stacked capacitors 416 and 417 in FIG. 4 are located at the Z-level of the X-Y location of the subsequent passive device 526. In an embodiment all capacitors 516 and 526 are semi-serpentine stacked capacitors. Similarly, at least three power rails such as a 1 V rail, a 1.5 V rail and a 1.8 V rail may be configured for each the capacitor locations 516, 576 and 526.

A redistribution layer 518 is on the die side 511 and the redistribution layer 518 is coupled to the first passive device 516 and to a first through-silicon via 520 in the first silicon interconnect bridge 512. The first through-silicon via 520 communicates to the package side 509. Similarly, the redistribution layer 518 is also coupled to the subsequent passive device 526 and to a subsequent through-silicon via 521 in the subsequent silicon interconnect bridge 512.

In an embodiment, the first passive device 516 is both coupled to the die side 511 and to the package side 509. Similarly in an embodiment, the subsequent passive device 526 is both coupled to the die side 511 and to the package side 509. At the package side 509, the first passive device 516 is coupled by an electrical interconnect 522 to an electrical bump in an array, one electrical bump of which is indicated by reference number 524.

In an embodiment, the passive device 516 is a first passive device 516 and the subsequent passive device 526 is in the molding-mass frame 514, such that the two passive devices 516 and 526 are on opposite sides of the respective first and subsequent silicon interconnect bridges 512 and 512'. As illustrated in an embodiment, the passive devices 516 and 526 are decoupling capacitors.

In an embodiment, a first integrated-circuit die 10 is on the redistribution layer 518 and a subsequent integrated-circuit die 20 is also on the redistribution layer 518, where the two IC dice 10 and 20 are side-by-side.

Interconnection between the two IC dice 10 and 20 is through an inter-die trace 528 in the RDL 518. In an embodiment, interconnection between the two IC dice 10 and 20 is by coupling through at least one of the first through-silicon via 520 and the subsequent TSV 521. In an embodiment, coupling between the two IC dice 10 and 20 is through the inter-die trace 528 in the RDL 518. In an embodiment, interconnection between the two IC dice 10 and 20 is both by an inter-die trace 528 in the RDL 518 and by at least one of the TSVs 520 and 521.

An integrated-circuit (IC) package substrate 530 includes a bridge side 531 and a land side 529. In an embodiment, the IC package substrate 530 includes interconnections on either side of and passing through a package core 532. A bridge-side redistribution layer (RDL) 534 and a land-side RDL 536, as well as through-core interconnects 538 provide electrical communication between the bridge side 531 and the land side 529 according to an embodiment. Within the IC package substrate 530 is a ground (Vss) plane 540 in the dielectric material of the IC package substrate 530, as well as a plurality of power (Vcc) planes 542 in the dielectric material.

In an embodiment, the land side 529 faces a board 544 such as a motherboard in a computing system, and an electrical bump array 546 is seen being brought toward the board 544. In an embodiment, the board 544 has an external shell 548 that provides at least one of physical and electrical insulative protection for components on the board 544. For example, the external shell 548 may be part of a hand-held computing system such as a communication device. In an embodiment, the external shell 548 is part of the exterior of a mobile computing platform such as a drone.

FIG. 5B is a top plan of portions of the integrated-circuit package apparatus 501 depicted in FIG. 5A including interstitial passive devices according to an embodiment. The integrated-circuit package apparatus 502 shows the first and subsequent IC dice 10 and 20 on the RDL 518. The passive devices 516, 576 and 526 are seen along a section line A-A', and the passive devices 516, 576, 577 and 526 are depicted in ghosted lines below the RDL 518. Further below the RDL 518, five columns of the electrical bumps 524 (in ghosted lines) are also depicted in an array on the bridge side 531 of the IC package substrate 530. One column of bumps 524 is below the interstitial passive device 576 (see FIG. 5B below). Two columns each of bumps 524 are below the passive devices 516 and 526 (see FIG. 5A) and they are not depicted in FIG. 5B.

Further in ghosted lines, the material of the molding-mass frame 514 occupies approximately the same perimeter as the RDL 518 and it houses the several passive devices 516, 576, 577 and 526. Consequently, the respective first and subsequent silicon interconnect bridge at 512 and 512' are framed by the material of the molding-mass frame 514.

FIG. 5C is a bottom view of the molded silicon-bridge interconnect depicted in FIG. 5A according to an embodiment. The package side 509 of the mold material that makes up the molding-mass frame 514, exhibits the several capacitors 524, 576, 577 and 526, which are depicted in ghosted lines as they may be embedded beyond the package side 509 of the mold material that makes up the molding-mass frame 514. As illustrated in FIG. 5A, 10 electrical bumps 524 are arrayed in columns that include seven rows. These electrical bumps 524 are on the package side 509 and are in solid lines as they are not behind the package side 509 of the MMMSiB 510.

FIGS. 6A through 6F represent fabrication of molded silicon-bridge interconnects for assembly to at least two IC dice and to a package substrate according to several embodiments. Although only two IC die, e.g. 10 and 20 are shown, four dice in a chipset may also be seated above the die sides on the RDLs, e.g., 118, 218, 318, 418 and 518. For example a chipset of a processor die 10 and a graphics die 20, is complement with a third die such as a memory die that has memory-controller hub or a platform-controller hub, and a fourth die such as a baseband processor. These four or more IC dice may be assembled 2.5-D style upon a given RDL according to several embodiments.

Figure 6A:
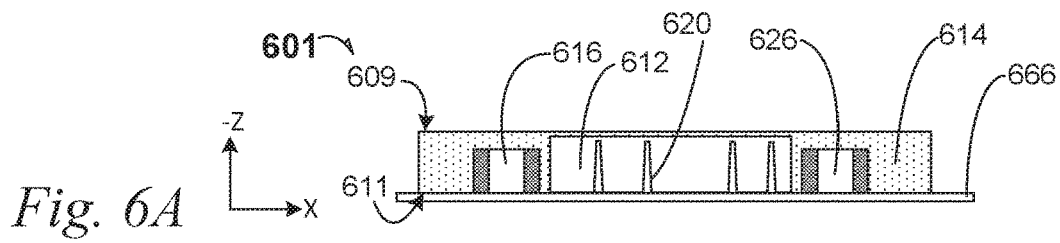
FIGS. 6A through 6F represent fabrication of molded silicon-bridge interconnects for assembly to at least two IC dice and to a package substrate according to several embodiments.

At FIG. 6A, a cross-section elevation of a molded silicon-interconnect bridge during assembly 601 according to an embodiment. A first carrier 666 supports a first passive device 616 and a subsequent passive device 626, and a silicon interconnect bridge 612. The silicon interconnect bridge 612 includes at least one TSV 620. The assembly of passive devices 616 and 626 and the silicon interconnect bridge 612 are overmolded by a molding mass material 614 such that a die side 611 and a package side 609 are formed for later assembly to IC dice and to a package. In an embodiment, a temporary bonding layer is disposed on the first carrier 666 to secure the first and subsequent passive devices 616, 626, and the silicon interconnect bridge 612.

Figure 6B:
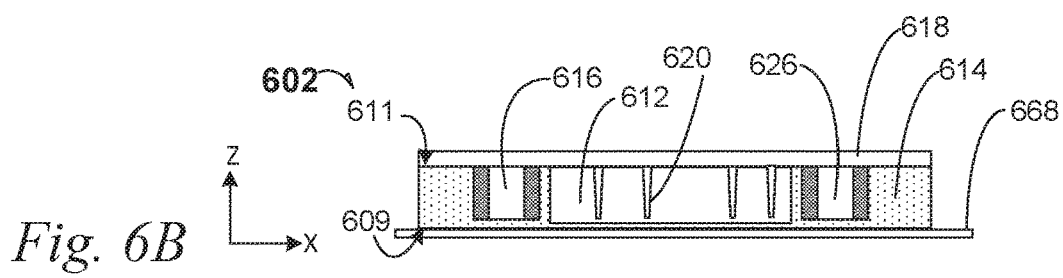

At FIG. 6B, the assembly 602 has been inverted and the first carrier 666 has been stripped from the die side 611. A second carrier 668 is assembled to the package side 609. A redistribution layer 618 has been fabricated on the die side 611 such that the passive devices 616 and 626, and the silicon interconnect bridge 612 are directly coupled to the RDL 618.

Figure 6C:
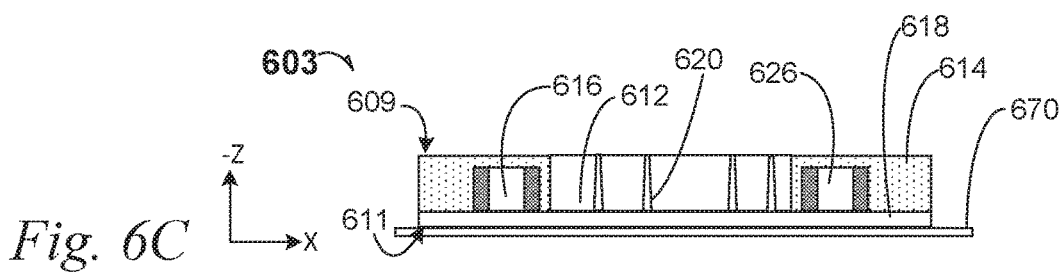

At FIG. 6C, the assembly 603 has been again inverted after removing the second carrier 668 from the package side 609. Further, a third carrier 670 has been assembled to the RDL 618 and the package side 609 has been processed by back-grinding to expose the silicon interconnect bridge 612 and the at least one TSV 620.

Figure 6D:
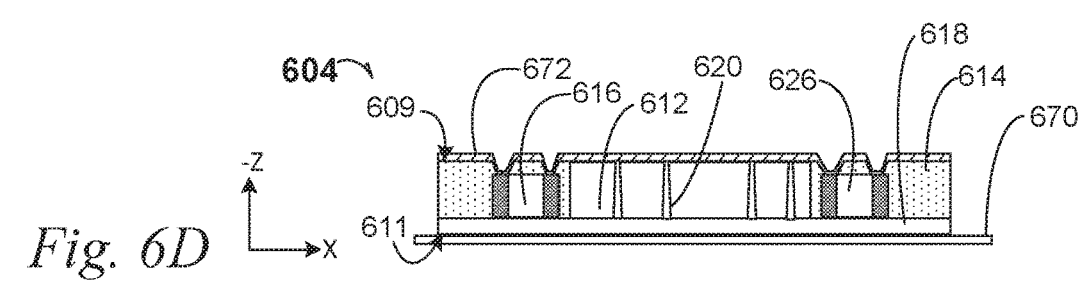
Figure 6E:
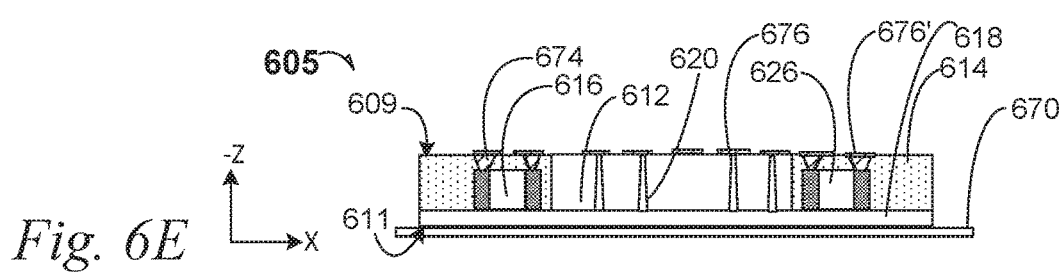
Figure 6F:
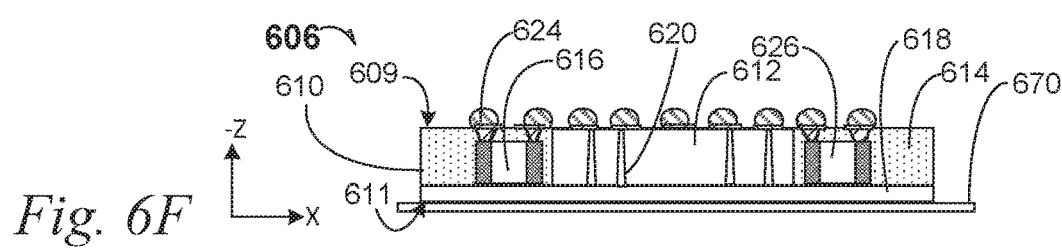

At FIG. 6D, the assembly 604 has been etched to open contact corridors to the several passive devices 616 and 626, and an electroless plating process has formed a seed layer 672 that contacts the several termini of the several passive devices 616 and 626, the silicon interconnect bridge 612 and the at least one TSV 620.

At 6E, the assembly 605 has been litho-patterned and electroplated to form a final package side 609, and to leave filled vias 674 in the several contact corridors within the molding mass material 614, which has now become the molding-mass frame, e.g., the molding-mass frame 114 depicted in FIG. 1A. In an embodiment, at least one TSV contact pad 676 is patterned and formed on the at least one TSV 620 at the package side 609.

At 6F, the assembly 606 has been bumped with several electrical bumps 624 in an array, for coupling the MSiB 610 to an integrated-circuit package at the package side 609, and after separation of the third carrier 670, the MSiB 610 can be assembled at the die side 611 to at least two IC dice according to several disclosed embodiments.

Figure 7:
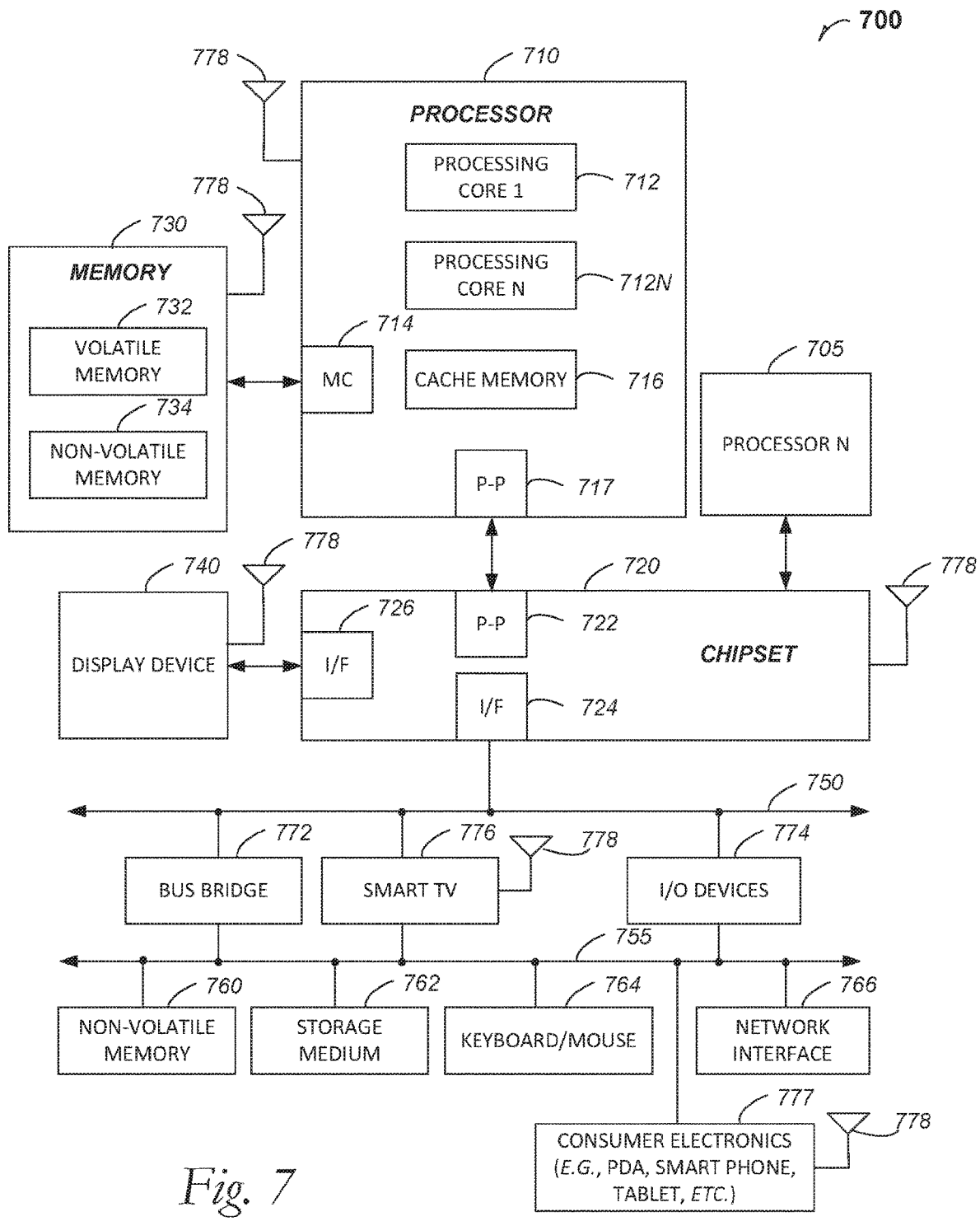
FIG. 7 is included to show an example of a higher-level device application for the disclosed embodiments.

FIG. 7 is included to show an example of a higher-level device application for the disclosed embodiments. The molded silicon-bridge interconnect embodiments may be found in several parts of a computing system. In an embodiment, the molded silicon-bridge interconnect embodiments can be part of a communications apparatus such as is affixed to a cellular communications tower. In an embodiment, a computing system 700 includes, but is not limited to, a desktop computer. In an embodiment, a computing system 700 includes, but is not limited to a laptop computer. In an embodiment, a computing system 700 includes, but is not limited to a tablet. In an embodiment, a computing system 700 includes, but is not limited to a notebook computer. In an embodiment, a computing system 700 includes, but is not limited to a personal digital assistant (PDA). In an embodiment, a computing system 700 includes, but is not limited to a server. In an embodiment, a computing system 700 includes, but is not limited to a workstation. In an embodiment, a computing system 700 includes, but is not limited to a cellular telephone. In an embodiment, a computing system 700 includes, but is not limited to a mobile computing device. In an embodiment, a computing system 700 includes, but is not limited to a smart phone. In an embodiment, a system 700 includes, but is not limited to an internet appliance. Other types of computing devices may be configured with the microelectronic device that includes molded silicon-bridge interconnect embodiments.

In an embodiment, the processor 710 has one or more processing cores 712 and 712N, where 712N represents the Nth processor core inside processor 710 where N is a positive integer. In an embodiment, the electronic device system 700 using a molded silicon-bridge interconnect embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the molded silicon-bridge interconnect element on an integrated-circuit package substrate in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. In an embodiment, the chipset 720 is part of a molded silicon-bridge interconnect embodiment depicted in FIG. 1A. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via. Point-to-Point (PtP or P-P) interfaces 717 and 722. Either of these PtP embodiments may be achieved using a molded silicon-bridge interconnect embodiment as set forth in this disclosure. The chipset 720 enables the processor 710 to connect to other elements in a molded silicon-bridge interconnect embodiment in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a molded silicon-bridge interconnect embodiment in a system. Additionally, the chipset 720 connects to one or more buses 750 and 755 that interconnect various elements 774, 760, 762, 764, and 766. Buses 750 and 755 may be interconnected together via a bus bridge 772 such as at least one molded silicon-bridge interconnect embodiment. In an embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid-state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the molded silicon-bridge interconnect embodiments in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

To illustrate the molded silicon interconnect bridge package embodiments and hods disclosed herein, a non-limiting list of examples is provided herein:

Example 1 is an integrated-circuit package substrate, comprising: a silicon interconnect bridge in a molding-mass frame, wherein the molding-mass frame has a die side and a package side, and wherein the silicon interconnect bridge shares the die side; a passive device in the molding-mass frame, wherein the silicon interconnect bridge and the passive device, occupy at least some of the same vertical space encompassed by the molding-mass frame; and a redistribution layer on the die side, wherein the redistribution layer is coupled to the passive device and to a through-silicon via in the silicon interconnect bridge, and wherein the through-silicon via communicates to the, package side.

In Example 2, the subject matter of Example 1 optionally includes a package substrate including a bridge side and a land side, and a ground (Vss) plane in a dielectric material and a power (Vcc) plane in the dielectric material; and where the bridge side of the package substrate is coupled to the package side through an electrical bump.

In Example 3, the subject matter of any one or more of Examples 1-2 optionally include wherein the redistribution layer is coupled at the die side to a first integrated-circuit die by a first electrical bump and to a subsequent integrated-circuit die by a subsequent electrical bump, and wherein communication between the first integrated-circuit die and the subsequent integrated-circuit die is by a trace in the redistribution layer.

In Example 4, the subject matter of any one or more of Examples 1-3 optionally include wherein the redistribution layer is coupled at the die side to a first integrated-circuit die by a first electrical bump and to a subsequent integrated-circuit die by a subsequent electrical bump, and wherein communication between the first integrated-circuit die and the subsequent integrated-circuit die is by the through-silicon via in the silicon interconnect bridge.

In Example 5, the subject matter of any one or more of Examples 1-4 optionally include wherein the redistribution layer is coupled at the die side to a first integrated-circuit die by a first electrical bump and to a subsequent integrated-circuit die by a subsequent electrical bump, wherein communication between the first integrated-circuit die and the subsequent integrated-circuit die is by the through-silicon via in the silicon interconnect bridge, and also by a trace in the redistribution layer.

In Example 6, the subject matter of any one or more of Examples 1-5 optionally include wherein the passive device is both coupled to the die side and to the package side.

In Example 7, the subject matter of any one or more of Examples 1-6 optionally include wherein the passive device is both coupled to the die side and to the package side, wherein the passive device is a first passive device, further including a subsequent passive device in the molding-mass frame, wherein the first passive device and the subsequent passive device are on opposite sides of the silicon interconnect bridge.

In Example 8, the subject matter of any one or more of Examples 1-7 optionally include wherein the passive device is a first capacitor, further including a subsequent capacitor, and wherein the first and subsequent capacitor are contacted at respective power terminals, to form a power rail.

In Example 9, the subject matter of any one or more of Examples 1-8 optionally include wherein the passive device is a first capacitor, further including a subsequent capacitor, and wherein the first and subsequent capacitor are contacted at respective power terminals, to form a power rail, further including: a package substrate including a bridge side and a land side, and a ground (Vss) plane in a dielectric material and a power (Vcc) plane in the dielectric material; where the bridge side of the package substrate is coupled to the package side through an electrical bump; and wherein the Vcc plane is coupled to the power rail.

In Example 10, the subject matter of any one or more of Examples 1-9 optionally include wherein the passive device is a first capacitor, further including a subsequent capacitor, and wherein the first and subsequent capacitor are contacted at respective power terminals, to form a power rail, further including: a third capacitor, wherein the third capacitor contacts the subsequent capacitor to form a Vss rail, and wherein the subsequent capacitor is stacked on the first capacitor and the third capacitor.

In Example 11, the subject matter of any one or more of Examples 1-10 optionally include wherein the passive device is a first capacitor, further including a subsequent capacitor, and wherein the first and subsequent capacitor are contacted at respective power terminals, to form a power rail; a third capacitor, wherein the third capacitor contacts the subsequent capacitor to form a Vss rail, and wherein the subsequent capacitor is stacked on the first capacitor and the third capacitor; a package substrate including a bridge side and a land side, and a ground (Vss) plane in a dielectric material and a power (Vcc) plane in the dielectric material; where the bridge side of the package substrate is coupled to the package side through an electrical bump; wherein the Vcc plane is coupled to the power rail; and wherein the Vss plane is coupled to the Vss rail.

Example 12 is an integrated-circuit package substrate, comprising: a first silicon interconnect bridge in a molding-mass frame, wherein the molding-mass frame has a die side and a package side, and wherein the first silicon interconnect bridge shares the die side; a subsequent silicon interconnect bridge in the molding-mass frame, wherein some molding-mass material of the molding-mass frame, spaces apart the first silicon interconnect bridge from the subsequent silicon interconnect bridge, and wherein the subsequent silicon interconnect bridge also shares the die side; an interstitial passive device in the molding-mass material between the first silicon interconnect bridge and the subsequent silicon interconnect bridge, wherein the first and subsequent silicon interconnect bridges and the interstitial passive device, occupy at least some of the same vertical space encompassed by the molding-mass frame; a redistribution layer on the die side, wherein the redistribution layer is coupled to the passive device and to a first through-silicon via in the first silicon interconnect bridge, and wherein the first through-silicon via communicates to the package side; and wherein the redistribution layer is coupled to the passive device and to a subsequent through-silicon via in the subsequent silicon interconnect bridge, and wherein the subsequent through-silicon via communicates to the package side.

In Example 13, the subject matter of Example 12 optionally includes a first capacitor in the molding-mass material and adjacent the first silicon interconnect bridge and opposite the interstitial passive device; a subsequent capacitor in the molding-mass material and adjacent the subsequent silicon interconnect bridge and opposite the interstitial passive device.

In Example 14, the subject matter of any one or more of Examples 12-13 optionally include a package substrate including a bridge side and a land side, and a ground (Vss) plane in a dielectric material and a power (Vcc) plane in the dielectric material; where the bridge side of the package substrate is coupled to the package side through an electrical bump; wherein the redistribution layer is coupled at the die side to a first integrated-circuit die by a first electrical bump and to a subsequent integrated-circuit die by a subsequent electrical bump, and wherein communication between the first integrated-circuit die and the subsequent integrated-circuit die is by a trace in the redistribution layer.

In Example 15, the subject matter of any one or more of Examples 12-14 optionally include wherein the redistribution layer is coupled at the die side to a first integrated-circuit die by a first electrical bump and to a subsequent integrated-circuit die by a subsequent electrical bump, and wherein communication between the first integrated-circuit die and the subsequent integrated-circuit die is by a trace in the redistribution layer.

In Example 16, the subject matter of any one or more of Examples 12-15 optionally include wherein the passive device is a capacitor that is both coupled to the die side and to the package side.

In Example 17, the subject matter of any one or more of Examples 12-16 optionally include a first-side first capacitor and a first-side subsequent capacitor in the molding-mass material and adjacent the first silicon interconnect bridge and opposite the interstitial passive device, wherein the first-side first capacitor and a first-side subsequent capacitor are contacted at respective power terminals, to form a first power rail; a subsequent-side first capacitor and a subsequent-side subsequent capacitor in the molding-mass material and adjacent the subsequent silicon interconnect bridge and opposite the interstitial passive device, wherein the subsequent-side first capacitor and a subsequent-side subsequent capacitor are contacted at respective power terminals, to form a subsequent power rail.

In Example 18, the subject matter of Example 17 optionally includes a package substrate including a bridge side and a land side, and a ground (Vss) plane in a dielectric material and a power (Vcc) plane in the dielectric material; where the bridge side of the package substrate is coupled to the package side through an electrical bump; and wherein the Vcc plane is coupled to at least one of the first power rail and the subsequent power rail.

In Example 19, the subject matter of Example 18 optionally includes a first-side third capacitor, wherein the first-side third capacitor contacts the first-side subsequent capacitor to form a Vss rail, and wherein the first-side subsequent capacitor is stacked on the first-side first capacitor and the first-side third capacitor.

Example 20 is a computing system comprising: a silicon interconnect bridge in a molding-mass frame, wherein the molding-mass frame has a die side and a package side, and wherein the silicon interconnect bridge shares the die side; a first integrated-circuit die on the die side, wherein the first IC die is a logic processor; a subsequent integrated-circuit die on the die side and adjacent the first integrated-circuit die, wherein the subsequent IC die is a graphics processor; a passive device in the molding-mass frame, wherein the silicon interconnect bridge and the passive device, occupy at least some of the same vertical space encompassed by the molding-mass frame; a redistribution layer on the die side, wherein the redistribution layer is coupled to the passive device and to a through-silicon via in the silicon interconnect bridge, and wherein the through-silicon via communicates to the package side; a package substrate including a bridge side and a land side, and a voltage-reference (Vss) plane in a dielectric material and a power (Vcc) plane in the dielectric material; where the bridge side of the package substrate is coupled to the package side through an electrical bump; wherein the redistribution layer is coupled at the die side to the first IC die by a first electrical bump and to the subsequent IC die by a subsequent electrical bump, and wherein communication between the first integrated-circuit die and the subsequent integrated-circuit die is by a trace in the redistribution layer; and wherein the molded silicon-interconnect bridge is part of a chipset.

In Example 21, the subject matter of Example 20 optionally includes a third IC die on the redistribution layer, wherein the third IC die is a memory die; and a board coupled to the package substrate at the land side, by an electrical-bump array.

In Example 22, the subject matter of Example 21 optionally includes wherein the hoard includes an external shell that is a dielectric material, and wherein the external shell is at least part of the exterior of an apparatus selected from a mobile computing system and a drone.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or ltd "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated-circuit (IC) package structure, comprising:
   a silicon interconnect bridge in a molding-mass frame, wherein the molding-mass frame has a die side and a package side, and wherein the silicon interconnect bridge shares the die side;
   a passive device in the molding-mass frame, wherein the silicon interconnect bridge and the passive device occupy at least some of the same vertical space encompassed by the molding-mass frame; and
   a redistribution layer on the die side, wherein the redistribution layer is coupled to the passive device and to a through-silicon via in the silicon interconnect bridge, wherein the through-silicon via is communicatively coupled to the package side, wherein the redistribution layer is coupled at the die side to a first IC die by a first electrical bump and to a second IC die by a second electrical bump, and wherein communication between the first IC die and the second IC die is by the through-silicon via in the silicon interconnect bridge.

2. The IC package structure of claim 1, further comprising:
   a package substrate comprising a bridge side and a land side, and a ground (Vss) plane in a dielectric material and a power (Vcc) plane in the dielectric material, wherein the bridge side of the package substrate is coupled to the package side through an electrical bump.

3. The IC package structure of claim 1, wherein communication between the first IC die and the second IC die is further by a trace in the redistribution layer.

4. The IC package structure of claim 1, wherein the passive device is both coupled to the die side and to the package side.

5. The IC package structure of claim 1, further comprising:
   a package substrate comprising a bridge side and a land side, wherein the bridge side of the package substrate is coupled to the package side; and
   a board coupled to the package substrate at the land side.

6. An integrated-circuit (IC) package structure, comprising:
   a first silicon interconnect bridge in a molding-mass frame, wherein the molding-mass frame has a die side and a package side, and wherein the first silicon interconnect bridge shares the die side;
   a second silicon interconnect bridge in the molding-mass frame, wherein some molding-mass material of the molding-mass frame, spaces apart the first silicon interconnect bridge from the second silicon interconnect bridge, and wherein the second silicon interconnect bridge also shares the die side;
   an interstitial passive device in the molding-mass material between the first silicon interconnect bridge and the second silicon interconnect bridge, wherein the first and second silicon interconnect bridges and the interstitial passive device occupy at least some of the same vertical space encompassed by the molding-mass frame, and wherein the interstitial passive device is a first capacitor that is both coupled to the die side and to the package side;
   a redistribution layer on the die side, wherein the redistribution layer is coupled to the interstitial passive device and to a first through-silicon via in the first silicon interconnect bridge, and wherein the first through-silicon via communicates to the package side, wherein the redistribution layer is coupled to the interstitial passive device and to a second through-silicon via in the second silicon interconnect bridge, and wherein the second through-silicon via is communicatively coupled to the package side;
   a second capacitor in the molding-mass material and adjacent the first silicon interconnect bridge and opposite the interstitial passive device; and
   a third capacitor in the molding-mass material and adjacent the second silicon interconnect bridge and opposite the interstitial passive device.

7. The IC package structure of claim 6, further comprising:
   a second capacitor and a third capacitor in the molding-mass material and adjacent the first silicon interconnect bridge and opposite the interstitial passive device, wherein the second capacitor and the third capacitor are contacted at respective power terminals, to form a first power rail.

8. The IC package structure of claim 7, further comprising:
   a fourth capacitor, wherein the fourth capacitor contacts the third capacitor to form a Vss rail, and wherein the third capacitor is stacked on the second capacitor and the fourth capacitor.

9. The IC package structure of claim 6, further comprising:
   a package substrate comprising a bridge side and a land side, wherein the bridge side of the package substrate is coupled to the package side; and
   a board coupled to the package substrate at the land side.

10. A computing system, comprising:
a silicon interconnect bridge in a molding-mass frame, wherein the molding-mass frame has a die side and a package side, and wherein the silicon interconnect bridge shares the die side;
a first integrated-circuit (IC) die on the die side, wherein the first IC die is a logic processor;
a second IC die on the die side and adjacent the first IC die, wherein the second IC die is a graphics processor;
a passive device in the molding-mass frame, wherein the silicon interconnect bridge and the passive device occupy at least some of the same vertical space encompassed by the molding-mass frame;
a redistribution layer on the die side, wherein the redistribution layer is coupled to the passive device and to a through-silicon via in the silicon interconnect bridge, and wherein the through-silicon via is communicatively coupled to the package side; and
a package substrate comprising a bridge side and a land side, and a ground (Vss) plane in a dielectric material and a power (Vcc) plane in the dielectric material,
wherein the bridge side of the package substrate is coupled to the package side through an electrical bump,
wherein the redistribution layer is coupled at the die side to the first IC die by a first electrical bump and to the second IC die by a second electrical bump, and wherein communication between the first IC die and the second IC die is by a trace in the redistribution layer, and
wherein the silicon interconnect bridge is part of a chipset.

11. The computing system of claim 10, further comprising:
a third IC die on the redistribution layer, wherein the third IC die is a memory die; and
a board coupled to the package substrate at the land side by an electrical-bump array.

12. The computing system of claim 11, wherein the board comprises an external shell that is a dielectric material, and wherein the external shell is at least part of an exterior of an apparatus selected from a mobile computing system and a drone.

13. An integrated-circuit (IC) package structure, comprising:
a silicon interconnect bridge in a molding-mass frame, wherein the molding-mass frame has a die side and a package side, and wherein the silicon interconnect bridge shares the die side;
a first capacitor in the molding-mass frame, wherein the silicon interconnect bridge and the first capacitor occupy at least some of the same vertical space encompassed by the molding-mass frame;
a second capacitor, wherein the first capacitor and the second capacitor are contacted at respective power terminals, to form a power rail; and
a redistribution layer on the die side, wherein the redistribution layer is coupled to the first capacitor and to a through-silicon via in the silicon interconnect bridge, and wherein the through-silicon via is communicatively coupled to the package side.

14. The IC package structure of claim 13, further comprising:
a package substrate comprising a bridge side and a land side, and a ground (Vss) plane in a dielectric material and a power (Vcc) plane in the dielectric material,
wherein the bridge side of the package substrate is coupled to the package side, and
wherein the Vcc plane is coupled to the power rail.

15. The IC package structure of claim 13, further comprising:
a third capacitor, wherein the third capacitor contacts the second capacitor to form a Vss rail, and wherein the second capacitor is stacked on the first capacitor and the third capacitor.

16. The IC package structure of claim 15, further comprising:
a package substrate comprising a bridge side and a land side, and a ground (Vss) plane in a dielectric material and a power (Vcc) plane in the dielectric material,
wherein the bridge side of the package substrate is coupled to the package side through an electrical bump,
wherein the Vcc plane is coupled to the power rail, and
wherein the Vss plane is coupled to the Vss rail.

17. The IC package structure of claim 13, further comprising:
a package substrate comprising a bridge side and a land side, wherein the bridge side of the package substrate is coupled to the package side; and
a board coupled to the package substrate at the land side.

* * * * *